(12) United States Patent
Thompson

(10) Patent No.: US 10,233,541 B2
(45) Date of Patent: Mar. 19, 2019

(54) DEPOSITION OF FILMS CONTAINING ALKALINE EARTH METALS

(71) Applicant: Applied Materials, Inc., Santa Clara, CA (US)

(72) Inventor: David Thompson, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 21 days.

(21) Appl. No.: 13/923,599

(22) Filed: Jun. 21, 2013

(65) Prior Publication Data
US 2014/0004274 A1    Jan. 2, 2014

Related U.S. Application Data

(60) Provisional application No. 61/666,069, filed on Jun. 29, 2012.

(51) Int. Cl.
*C23C 16/00* (2006.01)
*C23C 16/40* (2006.01)

(52) U.S. Cl.
CPC ................. *C23C 16/404* (2013.01)

(58) Field of Classification Search
CPC .................................................. C23C 16/404
USPC ..................................... 427/569, 248.1, 250
See application file for complete search history.

(56) References Cited

U.S. PATENT DOCUMENTS

| | | |
|---|---|---|
| 4,931,425 A | 6/1990 | Kimura et al. |
| 5,447,909 A | 9/1995 | Takahashi et al. |
| 5,846,332 A | 12/1998 | Zhao et al. |
| 6,079,356 A | 6/2000 | Umotoy et al. |
| 6,106,625 A | 8/2000 | Koai et al. |
| 6,821,563 B2 | 11/2004 | Yudovsky |
| 6,878,206 B2 | 4/2005 | Tzu et al. |
| 6,916,398 B2 | 7/2005 | Chen et al. |
| 7,204,886 B2 | 4/2007 | Chen et al. |
| 7,780,785 B2 | 8/2010 | Chen et al. |
| 2004/0023516 A1 * | 2/2004 | Londergan et al. .......... 438/785 |
| 2005/0095480 A1 | 5/2005 | Beatty et al. |
| 2006/0172484 A1 | 8/2006 | Chung et al. |
| 2008/0226924 A1 * | 9/2008 | Okubo et al. ................. 428/426 |
| 2010/0003406 A1 | 1/2010 | Lam et al. |
| 2012/0308739 A1 * | 12/2012 | Lansalot-Matras et al. ................ 427/569 |

FOREIGN PATENT DOCUMENTS

| | | |
|---|---|---|
| CN | 101182339 A | 5/2008 |
| JP | 02-088773 | 3/1990 |
| TW | 201120232 A1 | 6/2011 |
| WO | WO-2009/086263 | 7/2009 |
| WO | WO 2012/74511 A2 * | 7/2012 |

OTHER PUBLICATIONS

PCT International Search Report and Written Opinion in PCT/US2013/048420, dated Sep. 4, 2013, 13 pgs.
PCT International Preliminary Report on Patentability in PCT/US2013/048420, dated Jan. 8, 2015, 9 pages.

* cited by examiner

*Primary Examiner* — Kelly M Gambetta
(74) *Attorney, Agent, or Firm* — Servilla Whitney LLC

(57) ABSTRACT

Described are methods of depositing a metal film by chemical reaction on a substrate. The method comprises: exposing the substrate to flows of a first reactant gas comprising a group 2 metal and a second reactant gas comprising a halide to form a first layer containing a metal halide on the substrate; exposing the substrate to a third reactant gas comprising an oxidant to form a second layer containing a metal peroxide or metal hydroxide on the substrate during; exposing the substrate to heat or a plasma to convert the metal peroxide or metal hydroxide to metal oxide. The method may be repeated to form the metal oxide film absent any metal carbonate impurity.

16 Claims, No Drawings

DEPOSITION OF FILMS CONTAINING ALKALINE EARTH METALS

CROSS-REFERENCE TO RELATED APPLICATION

This application claims priority to U.S. Provisional Application No. 61/666,069, filed Jun. 29, 2012, the entire contents of which are hereby incorporated by reference.

TECHNICAL FIELD

Embodiments of the present invention generally relate to metal film deposition, and specifically to the deposition of films comprising group 2 metals.

BACKGROUND

Deposition of thin films on a substrate surface is an important process in a variety of industries, including semiconductor processing, diffusion barrier coatings, dielectrics for magnetic read/write heads, and random access memory. Metal oxide films incorporating transition metals are used in semiconductor applications including high K gate dielectric films, active materials for ferroelectric memories, thin film battery cathodes, materials in silicon based light emitting devices and memory cells. Many metal-oxygen condensed phase systems employ metal oxides that are known to be stable at different oxidation potentials and have well-defined stoichiometric phases. For these materials it is generally possible to consistently obtain a desired metal oxide once an oxidation potential threshold is exceeded, and equilibrium is reached.

Methods for deposition of thin films include chemical vapor deposition (CVD) and atomic layer deposition (ALD). CVD processes involve exposing a substrate to one or more volatile precursors which react and/or decompose onto the substrate to produce a film. Most ALD processes are based on binary reaction sequences, where each of the two surface reactions occurs sequentially. Because the surface reactions are sequential, the two gas phase reactants are not in contact, and possible gas phase reactions that may form and deposit particles are limited. Current methods for depositing metal oxide films, particularly strontium oxide films involve the use of ozone which results in the formation of $SrCO_3$, which is undesirable. Thus, there is a need to develop methods of depositing thin SrO films without the formation of $SrCO_3$.

SUMMARY

One aspect of the invention relates to a method of depositing a metal oxide film on a substrate. The method comprises (a) exposing a substrate surface to flows of a metal precursor and a halide precursor to provide a metal halide film on the substrate surface, wherein the metal comprises a group 2 metal; then (b) exposing a substrate surface containing the metal halide film to an oxidant; and (c) subsequently exposing the substrate surface to heat or a plasma to provide a metal oxide film on the substrate. In one or more embodiments, the method further comprises flowing a purge gas after each exposure. In one or more embodiments, (a), (b) or (c) is repeated one or more times.

In one or more embodiments, the metal precursor is selected from a strontium precursor, a calcium precursor and a magnesium precursor. In further embodiments, the metal precursor comprises $Sr(thd)_2$ (bis(tetramethylheptanedionate)strontium), $Sr(methd)_2$ (bis(methoxyethoxytetramethylheptanedionate)strontium), and $Sr(dpm)_2$ (bis(dipivaloylmethanate)strontium), $Ca(C_{11}H_{19}O_2)_2$ (bis(tetramethlheptanedionate)Calcium), $C_{10}H_2F_{12}O_4Ca$ (calcium hexfluoropentane-dionate), $C_6H_{14}O_4Ca$(calcium methoxyethoxide), $Mg(C_5H_5)_2$ (Bis(cyclopentadienyl) magnesium(II)), $C_{20}H_{30}Mg$ Bis(pentamethylcyclopentadienyl) magnesium, or ombinations thereof.

In some, the halide precursor comprises, $F_2$, $Cl_2$, $Br_2$, and $I_2$. In one or more embodiments, the oxidant comprises one or more of $H_2O$, $H_2O_2$, $O_2$, $O_3$, $N_2O$, NO, NOx, nitrates, alcohols, carboxylic acids, CO, $CO_2$, and HCOH. In one or more embodiments, the substrate is exposed to heat or a plasma.

A second aspect of the invention relates to a method of depositing a strontium oxide film on a substrate. The method comprises (a) exposing a substrate surface to alternating pulses of a strontium precursor and a halide precursor to provide a strontium halide film on the substrate surface; then (b) exposing the substrate surface containing a strontium halide film to an oxidant; and (c) exposing the substrate surface to heat or a plasma to provide a strontium oxide film on the substrate surface. In some embodiments, the strontium precursor comprises $Sr(thd)_2$ (bis(tetramethylheptanedionate) strontium), $Sr(methd)_2$ (bis(methoxyethoxytetramethylheptanedionate strontium), or $Sr(dpm)_2$ (bis(dipivaloylmethanate)strontium). In one or more embodiments, the halide precursor is selected from the list comprising, $F_2$, $Cl_2$, $Br_2$, and $I_2$.

In one or more embodiments, the oxidant comprises one or more of $H_2O$, $H_2O_2$, $O_2$, $O_3$, $N_2O$, NO, NOx, nitrates, alcohols, carboxylic acids, CO, $CO_2$, and HCOH. In one or more embodiments, the method further comprises flowing a purge gas after each exposure. In some embodiments, (a), (b) or (c) is repeated one or more times.

A third aspect of the invention relates to a method of depositing a strontium oxide metal film having no strontium carbonate incorporation on a substrate. The method comprises (a) disposing a substrate within a processing chamber; (b) performing a deposition process comprising: flowing a strontium precursor gas and $Cl_2$ gas to at least a portion of the substrate within the chamber under conditions which form a partial monolayer on the substrate, the partial monolayer comprising strontium terminated with chlorine, flowing a purge gas, flowing water vapor to the substrate within the chamber under conditions which form a partial monolayer on the substrate, the partial monolayer comprising $SrO_2$ or $Sr(OH)_2$ and flowing a purge gas; (c) exposing the substrate having the $SrO_2$ or $Sr(OH)_2$ containing film thereon to heat or a plasma, flowing a purge gas; and (d) repeating (b) and (c), wherein the deposition process is selected from chemical vapor deposition and atomic layer deposition or combinations thereof. In one or more embodiments, in (c), the substrate is exposed to heat.

DETAILED DESCRIPTION

Before describing several exemplary embodiments of the invention, it is to be understood that the invention is not limited to the details of construction or process steps set forth in the following description. The invention is capable of other embodiments and of being practiced or being carried out in various ways.

Although the invention herein has been described with reference to particular embodiments, it is to be understood that these embodiments are merely illustrative of the principles and applications of the present invention. It will be apparent to those skilled in the art that various modifications and variations can be made to the method and apparatus of the present invention without departing from the spirit and scope of the invention. Thus, it is intended that the present invention include modifications and variations that are within the scope of the appended claims and their equivalents.

In the semiconductor industry, in particular, miniaturization requires atomic level control of thin film deposition to produce conformal coatings on high aspect structures. One method for deposition of thin films is chemical vapor deposition (CVD) in which a gas phase chemical precursor molecule and a reactant gas are reacted on and/or above a temperature-controlled surface to form a thin film. The reactive species, energy, rate of chemical supply, substrate temperature and substrate itself contribute to determining the properties of the film. In a typical CVD process, the reactants are introduced into the reactor in gas phase and activated by heat, plasma or other means. The reactive species are then adsorbed onto the substrate surface, where they may undergo chemical reactions or react with other incoming species to form a solid film. Reaction by-products are desorbed from the substrate surface and removed or purged from the reactor.

A variation of chemical vapor deposition for deposition of thin films is atomic layer deposition (ALD), which employs sequential, self-limiting surface reactions to form layers of precise thickness controlled at the Ångstrom or monolayer level. Most ALD processes are based on binary reaction sequences which deposit a binary compound film. Each of the two surface reactions occurs sequentially, and because they are self-limiting, a thin film can be deposited with atomic level control. Because the surface reactions are sequential, the two gas phase reactants are not in contact and possible gas phase reactions that may form and deposit particles are limited. The self-limiting nature of the surface reactions also allows the reaction to be driven to completion during every reaction cycle, resulting in films that are continuous and pinhole-free.

As used in this specification and the appended claims, the term "purge" is used to mean any process in which the contents of a system are removed. Purging can mean that the contents (e.g., a gaseous reactant) are removed by being replaced with another gas (e.g., an inert gas) or removed by introducing a vacuum (or partial vacuum) to the system.

According to one or more of the embodiments, the invention relates to a method of depositing a metal oxide film by chemical reaction. The methods, also referred to as processes, include sequentially exposing a substrate, or portion of a substrate, to various deposition gases containing chemical precursors or reactants including a first reactant gas, a second reactant gas and a third reactant gas. Between the exposures, a purge gas can be flowed. The first reactant gas and second reactant gas form at least a partial layer of metal halide on the substrate during a first deposition process. The substrate is also exposed, sequentially, to a third reactant gas. The third reactant gas forms at least a partial layer of metal peroxide/metal hydroxide on the substrate during a second deposition process. The substrate is then exposed to heat or to a plasma to provide a metal oxide film on the substrate having a desired thickness. Skilled artisans will understand that the first deposition process can be repeated multiple times before the second deposition process, and that the second deposition process can be repeated multiple times before the first deposition process, and that either process can be performed first.

In a specific embodiment, the first reactant gas can include a metal precursor containing any suitable alkaline earth metal or Group 2 metal known to the skilled artisan. Suitable Group 2 metals include strontium, calcium, magnesium and the like. Such suitable metal species are those that form stable carbonates. A list of suitable alkaline earth metal precursors includes, $Sr(thd)_2$ (bis(tetramethylheptanedionate) strontium), $Sr(methd)_2$ (bis(methoxyethoxytetramethylheptanedionate) strontium), and $Sr(dpm)_2$ (bis(dipivaloylmethanate)strontium), $Ca(C_{11}H_{19}O_2)_2$ (bis(tetramethylheptanedionate)Calcium), $C_{10}H_2F_{12}O_4Ca$ (calcium hexfiurorpentant-dionate), $C_6H_{14}O_4Ca$ (calcium-methoxyethoxide), $Mg(C_5H_5)_2$ (Bis(cyclopentadienyl)magnesium(II)), $C_{20}H_{30}Mg$ Bis(pentamethyl cyclopentadienyl) magnesium, and combinations thereof. In another embodiment, the second reactant gas can include any suitable halide containing gas known to the skilled artisan. Suitable halide species include, $F_2$, $Cl_2$, $Br_2$, $I_2$, and the like. In another embodiment the substrate is exposed to a third reactant gas comprising an OH containing species or an oxidant. In another embodiment, suitable oxidants include, but are not limited to, $H_2O$, $H_2O_2$, $O_2$, $O_3$, $N_2O$, NO, NOx, nitrates, alcohols, carboxylic acids, CO, $CO_2$, and HCOH. Specifically, in some embodiments, the oxidant comprises water. In a specific embodiment, the methods of the invention form a first layer containing a metal halide on the substrate during a first deposition cycle and then during a second deposition cycle, the metal halide containing substrate is exposed to an oxidant to provide a layer containing a metal peroxide or metal hydroxide on the substrate. In another embodiment, the substrate is exposed to heat or to a plasma to provide the desired metal oxide film. Specifically, the methods include repeating the first, second, or third cycles to form the metal oxide film. Specifically, the metal oxide film is substantially free of any metal carbonate formation. More specifically, the metal oxide film contains no metal carbonate formation.

In detailed embodiments, the methods include exposing the substrate to heat or to a plasma to obtain the desired metal oxide film. In one embodiment, the substrate is heated.

Plasmas may be used for treating the films described herein. In one embodiment, the substrate is exposed to a plasma gas. Typical plasma gases may contain inert gases, such as for example, nitrogen, hydrogen, argon, neon, helium, or combinations thereof. The plasma may be generated externally from the processing chamber, such as by a remote plasma generator system. Typically, a plasma may be remotely generated from a microwave (MW) frequency generator or a radio frequency (RF) generator.

A list of suitable metal oxide films contemplated by the invention includes but is not limited to: SrO, MgO, CaO.

In detailed embodiments, the method comprises, disposing a substrate within a processing chamber and performing a first deposition cycle comprising first flowing a gas containing a strontium precursor and a gas containing halide precursor to at least a portion of the substrate within the chamber under conditions which form a partial monolayer on the substrate, the partial monolayer comprising strontium terminated with chlorine, followed by flowing a purge gas into the chamber. Then, water vapor may be flowed to the substrate within the chamber under conditions which form a partial monolayer on the substrate; the partial monolayer comprising strontium hydroxide, followed by flowing a purge gas into the chamber. This can then be followed by applying heat or flowing a plasma to least a portion of the substrate within the chamber under conditions which form a layer comprising strontium oxide, followed by flowing a purge gas into the chamber. The first, second and third processes or cycles are then repeated until the desired thickness of the strontium oxide film is reached.

During the purge, typically an inert gas is introduced into the processing chamber to purge the reaction zone or otherwise remove any residual reactive compound or by-products from the reaction zone. Alternatively, the purge gas may flow continuously throughout the deposition process so that only the purge gas flows during a time delay between disposure of the reactant gases.

Thin metal oxide films are very desirable in the semiconductor industry. Specific embodiments are directed to methods of obtaining strontium oxide films. Previous methods involved using strontium precursors with ozone in a deposition cycle. This typically resulted in the formation of strontium carbonate ($SrCO_3$) incorporation in the film, which is an undesirable impurity. To avoid strontium carbonate incorporation, in specific embodiments, a strontium precursor, selected from the list comprising $Sr(thd)_2$ (bis (tetramethylheptanedionate) strontium), $Sr(methd)_2$ (bis (methoxyethoxytetramethylheptanedionate strontium), $Sr(dpm)_2$ (bis(dipivaloylmethanate)strontium) and the like, can be pulsed into a chamber containing a substrate. Then a halide precursor, such as, for example $Cl_2$, can be pulsed in to the chamber to form a partial monolayer comprising strontium chloride ($SrCl_2$). This is followed by a purge gas. Then water vapor may be flowed to the substrate within the chamber under conditions which form a partial monolayer on the substrate; the partial monolayer comprising strontium hydroxide ($Sr(OH)_2$) or strontium peroxide ($SrO_2$), followed by flowing a purge gas into the chamber. It should be understood that a variety oxidants including water vapor, $H_2O_2$, $O_2$, $O_3$, $N_2O$, NO, NOx, nitrates, alcohols, carboxylic acids, CO, $CO_2$, HCOH, and the like can be flowed into the chamber to provide the desired $Sr(OH)_2$ or SrO2. Subsequently, the substrate can be exposed to heat or to a plasma to provide the required strontium oxide (SrO) containing film on the substrate. The pulse/purge cycles are repeated one or more times until the desired thickness of the strontium oxide containing film is achieved.

Whilst not wishing to be bound by theory, $SrCl_2$ is involatile and thus behaves like NaCl in that it has no vapor pressure and consists of large networks of anions and cations. When $SrCl_2$ is reacted with water vapor, $SrO_2$ is deposited with HCl as a byproduct. Unlike previous methods involving strontium precursors and ozone, which resulted in $SrCO_3$ formation, the use of involatile halides as intermediates such as in the methods of the invention, was previously unknown. Thus, the methods of the invention described herein, provide a marked improvement in strontium oxide film deposition.

In one embodiment of the invention the methods are carried out sequentially, in situ, without exposing the substrates to air.

Specific embodiments of the invention are directed to methods of obtaining metal oxide films absent of any metal carbonate impurity on a substrate. In particular, films such as SrO and CaO and MgO are prepared by vapor deposition such as CVD, ALD or plasma-enhanced CVD (PE-CVD) and plasma-enhanced ALD (PE-ALD). A processing chamber is configured to expose the substrate to a sequence of gases and/or plasmas during the deposition process.

In some embodiments, the substrate is exposed to a first reactant gas and a second reactant gas. The exposure to these first and second gases can be substantially simultaneously, as in a CVD reaction, or sequentially, as in an ALD reaction. As used in this specification and the appended claims, the term "substantially simultaneously" means that the two precursor gases are flowed into the chamber to react with each other and the substrate surface together. It will be understood by those skilled in the art that there may be areas of the substrate which are briefly exposed to one precursor only until the other precursor diffuses to the same area.

In atomic layer deposition type chambers, the substrate can be exposed to the first and second reactant gases either spatially or by a time domain processes. Time domain ALD is a traditional process in which the first reactant gas flows into the chamber to react with the surface. The first reactant gas is purged from the chamber before flowing the second reactant gas. In spatial ALD, both the first and second reactant gases are simultaneously flowed to the chamber but are separated spatially so that there is a region between the flows that prevents mixing of the gases. In spatial ALD, the substrate must be moved relative to the gas distribution plate, or vice-versa.

In some embodiments, a plasma system and a processing chamber or system which may be used during methods described here for depositing or forming metal oxide materials include the TXZ® CVD, chamber available from Applied Materials, Inc., located in Santa Clara, Calif. Further disclosure of plasma systems and processing chambers is described in commonly assigned U.S. Pat. Nos. 5,846, 332, 6,079,356, and 6,106,625. In other embodiments, a PE-ALD processing chamber or system which may be used during methods described here for depositing or forming metal oxide materials is described in commonly assigned U.S. Ser. No. 12/494,901, filed on Jun. 30, 2009, published as United States patent application publication number 2010/0003406. An ALD processing chamber used in some embodiments described herein may contain a variety of lid assemblies. Other ALD processing chambers may also be used during some of the embodiments described herein and are available from Applied Materials, Inc. A detailed description of an ALD processing chamber may be found in commonly assigned U.S. Pat. Nos. 6,821,563, 6,878,206, 6,916,398, and 7,780,785. In another embodiment, a chamber configured to operate in both an ALD mode as well as a conventional CVD mode may be used to deposit metal oxide materials is described in commonly assigned U.S. Pat. No. 7,204,886.

Reference throughout this specification to "one embodiment," "certain embodiments," "one or more embodiments," "an embodiment," "one aspect," "certain aspects," "one or more embodiments" and "an aspect" means that a particular feature, structure, material, or characteristic described in connection with the embodiment is included in at least one embodiment of the invention. Thus, the appearances of the phrases such as "in one or more embodiments," "in certain embodiments," "in one embodiment," "in an embodiment," "according to one or more aspects," "in an aspect," etc., in various places throughout this specification are not necessarily referring to the same embodiment or aspect of the invention. Furthermore, the particular features, structures, materials, or characteristics may be combined in any suitable manner in one or more embodiments or aspects. The order of description of the above method should not be considered limiting, and methods may use the described operations out of order or with omissions or additions.

It is to be understood that the above description is intended to be illustrative, and not restrictive. Many other embodiments will be apparent to those of ordinary skill in the art upon reviewing the above description. The scope of the invention should, therefore, be determined with reference to the appended claims, along with the full scope of equivalents to which such claims are entitled.

What is claimed is:

1. A method of depositing a metal oxide film on a substrate comprising:
   (a) exposing the substrate surface to a group 2 metal precursor and a halide precursor to provide a group 2 metal halide film on the substrate surface, the group 2 metal precursor comprising a metal that forms stable carbonates and selected from bis(methoxyethoxytetramethylheptanedionate) strontium ($Sr(methd)_2$), calcium hexafluoropentanedionate ($C_{10}H_2F_{12}O_4Ca$), calcium methoxyethoxide ($C_6H_{14}O_4Ca$), bis(cyclopentadienyl) magnesium ($Mg(C_5H_5)_2$), bis(pentamethylcyclopentadienyl) magnesium ($C_{20}H_{30}Mg$), or combinations thereof, the halide precursor selected from $Cl_2$, $Br_2$, or $I_2$;
   (b) exposing the substrate surface containing the group 2 metal halide film to an oxidant; and
   (c) subsequently exposing the substrate surface to heat or a plasma to provide a group 2 metal oxide film on the substrate, the group 2 metal oxide film being substantially free of metal carbonate.

2. The method of claim 1, further comprising flowing a purge gas after each exposure.

3. The method of claim 1, wherein (a), (b) or (c) is repeated one or more times.

4. The method of claim 1 wherein the metal precursor comprises bis(methoxyethoxytetramethylheptanedionate) strontium (Sr(methd)2), calcium methoxyethoxide (C6H14O4Ca), or combinations thereof.

5. The method of claim 1 wherein the oxidant comprises one or more of $H_2O$, $H_2O_2$, $O_2$, $O_3$, $N_2O$, NO, NOx, nitrates, alcohols, carboxylic acids, CO, $CO_2$, and HCOH.

6. The method of claim 1, wherein the metal oxide film has a thickness up to about 500 Å.

7. The method of claim 1 wherein the substrate is exposed to heat.

8. The method of claim 1 wherein the substrate is exposed to a plasma.

9. A method of depositing a film on a substrate, the method comprising:
   (a) exposing a substrate surface to alternating pulses of a strontium precursor, a magnesium precursor, or a calcium precursor, and a halide precursor to provide a strontium halide film, a magnesium halide film, or a calcium halide film on the substrate surface, wherein the strontium precursor, the magnesium precursor, or the calcium precursor is selected from: bis(methoxyethoxytetramethylheptanedionate) strontium (Sr (methd)$_2$), calcium hexafluoropentanedionate ($C_{10}H_2F_{12}O_4Ca$), calcium methoxyethoxide ($C_6H_{14}O_4Ca$), bis(cyclopentadienyl) magnesium (Mg($C_5H_5$)$_2$), or bis(pentamethylcyclopentadienyl) magnesium ($C_{20}H_{30}Mg$), and the halide precursor is selected from $F_2$, $Cl_2$, $Br_2$, or $I_2$; then
   (b) exposing the substrate surface containing the strontium halide film, the magnesium halide film, or the calcium halide film to an oxidant to form at least a partial layer comprising strontium peroxide, strontium hydroxide, magnesium peroxide, magnesium hydroxide, calcium peroxide or calcium hydroxide; and
   (c) subsequently exposing at least the at least partial layer comprising strontium peroxide, strontium hydroxide, magnesium peroxide, magnesium hydroxide, calcium peroxide or calcium hydroxide to a plasma to provide a strontium oxide, a magnesium oxide, or a calcium oxide film on the substrate surface, wherein the strontium oxide, magnesium oxide or calcium oxide film is substantially free of carbonate.

10. The method of claim 9, wherein the substrate is exposed to the strontium precursor.

11. The method of claim 9, wherein the oxidant comprises one or more of $H_2O$, $H_2O_2$, $O_2$, $O_3$, $N_2O$, NO, NOx, nitrates, alcohols, carboxylic acids, CO, $CO_2$, and HCOH.

12. The method of claim 9, further comprising flowing a purge gas after each exposure.

13. The method of claim 9, wherein (a), (b) or (c) is repeated one or more times.

14. A method of depositing a strontium oxide metal film having no strontium carbonate incorporation on a substrate, the method comprising:
   (a) disposing a substrate within a processing chamber;
   (b) performing a deposition process comprising:
      (i) flowing a strontium precursor gas comprising bis(methoxyethoxytetramethylheptanedionate) strontium ($Sr(methd)_2$), and $Cl_2$ gas to at least a portion of the substrate within the chamber under conditions which form a partial monolayer on the substrate, the partial monolayer comprising strontium terminated with chlorine,
      (ii) flowing a purge gas,
      (iii) flowing water vapor to the substrate within the chamber under conditions which form a partial monolayer on the substrate, the partial monolayer comprising $SrO_2$ or $Sr(OH)_2$ and
      (iv) flowing a purge gas;
   (c) exposing the substrate having the $SrO_2$ or $Sr(OH)_2$ containing film thereon to heat or a plasma to form a strontium oxide film substantially free of carbonate,
      (i) flowing a purge gas; and
   (d) repeating (b) and (c);
wherein the deposition process is selected from chemical vapor deposition and atomic layer deposition or combinations thereof.

15. The method of claim 14 wherein in step (c), the substrate is exposed to heat.

16. The method of claim 14, wherein the metal oxide film has a thickness up to about 500 Å.

* * * * *